(12) United States Patent
Raad et al.

(10) Patent No.: US 7,061,817 B2
(45) Date of Patent: Jun. 13, 2006

(54) DATA PATH HAVING GROUNDED PRECHARGE OPERATION AND TEST COMPRESSION CAPABILITY

(75) Inventors: George Raad, Boise, ID (US); Chulmin Jung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 10/883,619

(22) Filed: Jun. 30, 2004

(65) Prior Publication Data

US 2006/0002206 A1    Jan. 5, 2006

(51) Int. Cl.
*G11C 29/00* (2006.01)

(52) U.S. Cl. ................ 365/201; 365/203; 365/190
(58) Field of Classification Search .............. 365/201, 365/203, 190, 63, 230.06, 191, 189.01
See application file for complete search history.

(56) References Cited

U.S. PATENT DOCUMENTS

| | | | |
|---|---|---|---|
| 5,590,086 A | 12/1996 | Park et al. ............. | 365/230.03 |
| 6,137,737 A | 10/2000 | Mullarkey et al. ........... | 365/201 |
| 6,198,681 B1 | 3/2001 | Forbes ..................... | 365/205 |
| 6,212,109 B1 | 4/2001 | Proebsting ................ | 365/190 |
| 6,249,471 B1 | 6/2001 | Roy ........................ | 365/207 |
| 6,314,038 B1 | 11/2001 | Kim et al. ................ | 365/203 |
| 6,373,753 B1 | 4/2002 | Proebsting ............. | 365/189.09 |
| 6,411,553 B1 | 6/2002 | Wright et al. .......... | 365/189.05 |
| 6,418,067 B1 | 7/2002 | Watanabe et al. ........... | 365/200 |
| 6,462,998 B1 | 10/2002 | Proebsting ................... | 365/205 |
| 6,483,351 B1 | 11/2002 | Sim .............................. | 327/52 |
| 6,483,353 B1 | 11/2002 | Kim et al. ...................... | 327/55 |
| 6,687,161 B1 | 2/2004 | Marotta et al. ......... | 365/185.21 |
| 6,704,828 B1 | 3/2004 | Merritt et al. .............. | 710/305 |
| 6,741,104 B1 | 5/2004 | Forbes et al. .................. | 327/55 |
| 6,754,119 B1 | 6/2004 | Lee et al. ................... | 365/205 |
| 2002/0149399 A1 | 10/2002 | Baker .......................... | 327/55 |
| 2004/0037114 A1 | 2/2004 | Abedifard et al. ...... | 365/185.13 |
| 2004/0085840 A1 | 5/2004 | Vali et al. ................... | 365/202 |
| 2004/0085841 A1* | 5/2004 | Lim et al. .................... | 365/203 |
| 2004/0109373 A1* | 6/2004 | Kim ............................ | 365/203 |

* cited by examiner

*Primary Examiner*—Richard Elms
*Assistant Examiner*—Dang Nguyen
(74) *Attorney, Agent, or Firm*—Dorsey & Whitney LLP

(57) ABSTRACT

A data path for coupling data between a memory cell and an input/output (IO) line sense amplifier. An IO line coupling circuit is coupled to a pair of global data lines and a pair of local data lines to couple and decouple each of the global data lines to and from a voltage supply based on the voltage levels of the local data lines for the memory read operation. For the memory write operation, the IO line coupling circuit couples and decouples each of the global data lines to and from a respective one of the local data lines. The data path also includes a first precharge circuit coupled to the global data lines to couple the global data lines to ground to precharge the signal lines prior to a memory read or write operation, and can further include a test compression circuit coupled to the global data lines.

21 Claims, 5 Drawing Sheets

DATA PATH HAVING GROUNDED PRECHARGE OPERATION AND TEST COMPRESSION CAPABILITY

TECHNICAL FIELD

The invention relates generally to integrated circuit memory devices, and more particularly, to a data path in a memory device.

BACKGROUND OF THE INVENTION

As the processing speed of microprocessors increases, the demand for memory devices having faster access times also increases. Memory system designers have developed methods and designs that shave off nanoseconds from access times in order to satisfy the demand for high speed memory devices while operating under low voltage conditions. Even with the advances made in memory device designs, the fundamental building blocks of memory devices have remained relatively the same. As will be described in more detail below, these building blocks are the basic elements that are shared among all types of memory devices, regardless of whether they are synchronous or asynchronous, random-access or read-only, or static or dynamic.

A conventional memory device is illustrated in FIG. 1. The memory device includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory bank arrays 20 and 22 depending upon the state of a bank address bit forming part of the row address. The arrays 20 and 22 are comprised of memory cells arranged in rows and columns. Associated with each of the arrays 20 and 22 is a respective row address latch 26, which stores the row address, and a row decoder 28, which applies various signals to its respective array 20 or 22 as a function of the stored row address.

After the row address has been applied to the address register 12 and stored in one of the row address latches 26, a column address is applied to the address register 12. The address register 12 couples the column address to a column address latch 40. The column address latch 40 momentarily stores the column address while it is provided to the column address buffer 44. The column address buffer 44 applies a column address to a column decoder 48, which applies various column signals to respective sense amplifiers and associated column circuits 50 and 52 for the respective arrays 20 and 22. Data to be read from one of the arrays 20 or 22 are coupled from the arrays 20 or 22, respectively, to a data bus 58 through the column circuit 50 or 52, respectively, and a read data path that includes a data output buffer 56. Data to be written to one of the arrays 20 or 22 are coupled from the data bus 58 through a write data path, including a data input buffer 60, to one of the column circuits 50 or 52 where they are transferred to one of the arrays 20 or 22, respectively. The read data path and the write data path generally represent a data path of the memory device 10.

The above-described operation of the memory device 10 is controlled by a command decoder 68 responsive to high level command signals received on a control bus 70. These high level command signals, which are typically generated by the memory controller, are a chip select signal CS*, a write enable signal WE*, a row address strobe signal RAS*, and a column address strobe signal CAS*, where the "*" designates the signal as active low. The command decoder 68 generates a sequence of command signals responsive to the high level command signals to carry out a function (e.g., a read or a write) designated by each of the high level command signals. These command signals, and the manner in which they accomplish their respective functions, are conventional. Therefore, in the interest of brevity, a further explanation of these control signals will be omitted.

As mentioned above, read data are coupled from one of the arrays 20 and 22 to the data output buffer 56 and the data bus 58 through a read data path that is shown in greater detail in FIG. 2. FIG. 2 illustrates a conventional data path 200 for a memory device. The data path 200 includes a plurality of local input/output (LIO) lines 204, 208, 212 coupled to a global input/output (GIO) line 220. The LIO lines 204, 208, 212 are represented by a pair of signal lines that are coupled to a respective signal line of the GIO through respective pairs of NMOS pass gates 224a, 224b, 224c. Coupled to the LIO lines 204, 208, 212 are respective LIO precharge circuits 240 to precharge the LIO lines 204, 208, 212 to an internal voltage level VINT. A GIO precharge circuit 244 is coupled to the GIO line 220 to precharge the GIO line 220 to the VINT voltage level as well. A global sense amplifier 250 is coupled to the GIO line 220 to sense a voltage or current difference between the GIO signal lines 220a, 220b and in response generate an output signal that is provided to the output buffer 56 (FIG. 1).

Each of the LIO lines 204, 208, 212 is further coupled to either of the memory arrays 20, 22 through sense amplifiers 50, 52, all respectively. As shown in FIG. 2, the LIO lines 204, 208, 212 are coupled to the memory array 20 and sense amplifiers 50. The memory array 20 and sense amplifiers 50 previously described with respect to FIG. 1 are segmented such that a segment is associated with a respective one of the LIO lines 204, 208, 212. Each of the columns of memory cells of the memory cell array 20 is represented by a pair of digit lines (not shown) coupled to a respective one of the sense amplifiers 50. As known in the art, when the memory cell array 20 is accessed, a row of memory cells (not shown) are activated, and the sense amplifiers 50 amplify data for the respective column by coupling each of the digit lines of the selected column to a voltage supply or ground so that the digit lines have a complementary logic levels.

In operation, when a memory cell is read, a selected pair of digit lines of a column of memory is coupled to the LIO line 204, 208, 212 associated with the memory cell being accessed based on a column address provided to the memory device. Selection of a the column of memory coupled to the LIO line 204, 208, 212 is made by a common column decoder (not shown) coupled to the sense amplifiers 50a–50c. As known, in normal operation only one of the LIO lines 204, 208, 212 is coupled to the GIO line 220 through the respective NMOS passgates 224 during the read operation. By coupling the particular LIO line to the GIO line 220, a potential difference is created in the pairs of GIO signal lines 220a, 220b. The potential difference is detected by the GIO sense amplifier 250, and in response, an output signal is generated to be provided to the output buffer 56 (FIG. 1).

Typically, the GIO lines 140 are physically long signal lines that are routed over the memory device and are selectively coupled through the physically shorter LIO lines to a respective current sense amplifier 50. Due to its length, the GIO lines 220 have considerable line impedance that can significantly increase the time for sensing read data from the memory cell array 20 when voltage mode sensing is used since the sense amplifier coupled to the LIO line will need to drive the signal lines of the GIO lines 220 to complementary levels. Similarly, when data is written to a memory cell, the line impedance will also negatively affect the write time. That is, to write the data to the memory cell, the GIO signal lines 220a, 220b are driven to the appropriate voltage levels representative of the data to be written and its complement by the GIO sense amplifier 250 in order to set the selected sense amplifier (not shown) coupled to the LIO signal lines, either 204, 208, or 212, depending on which memory array 20a, 20b, or 20c to which the data is being written, to the appropriate voltage levels to write the data. As known in the art, the speed at which a sense amplifier is set to the appropriate voltage levels is based on the time to drive one input/output node of the sense amplifier to ground. With the physically long GIO lines 220a, 220b precharged to the VINT voltage level, the amount of time to transition the LIO signal lines from the VINT voltage level to ground can be prohibitive.

As well known, the memory cells of a memory device are tested for functionality, with defective memory cells being repaired through the use of redundant memory. As memory densities have increased, the time for testing the functionality of all of the memory cells of the memory device has also increased. Various circuits for test compression have been designed into the memory devices as an approach to alleviate this problem. Typically, a test mode is invoked, and the functionality of multiple memory cells are tested concurrently by reading the data from the multiple memory cells and "compressing" the data through logic circuitry to produce a single flag having a logic state that is indicative of whether the data from any of the multiple memory cells do not match the data that is expected. Thus, rather than reading data from each memory cell individually, groups of memory cells can be tested concurrently with the flag indicating whether any of the multiple memory cells is defective.

As shown in FIG. 2, the conventional data path 200 cannot perform test compression for multiple cells located in the memory arrays 20a–c. In the event of an error, the GIO signal lines 220a, 220b would have an unknown voltage due to the coupling of the GIO signal lines 220a, 220b to different voltages through the LIO signal lines coupled to the defective memory cell and through the LIO signal lines coupled to the functional memory cells. For example, assuming that the memory cells located in the memory arrays 20a, 20b are functional, and the memory cell located in the memory array 20c is defective, the complementary voltages of the LIO signal lines 212a, 212b are opposite of the complementary voltages of the LIO signal lines 204a, 204b and 208a, 208b. Consequently, when the NMOS passgates 224a–c are activated to couple the LIO lines 204, 208, 212 to the GIO line 220, the different complementary voltages of the respective LIO signal lines will cause the voltage of the GIO signal lines 220a, 220b to be neither ground nor VINT. Thus, the GIO sense amplifier will not be able to determine from the unknown voltage levels of the GIO signal lines 220a, 220b what output signal to generate.

Therefore, there is a need for a data path that facilitates high speed memory operations and that can be used to provide test compression functionality.

SUMMARY OF THE INVENTION

A data path according to one embodiment of the invention provides the coupling of data between a memory cell and an input/output (IO) line sense amplifier. The data path includes a pair of global input/output (GIO) signal lines coupled to an input of the IO line sense amplifier and further includes a pair of local input/output (LIO) signal lines coupled to a column of memory having the memory cell during a memory read or write operation. An IO line coupling circuit is coupled to the GIO and LIO signal lines to couple and decouple each of the GIO signal lines to and from a voltage supply in accordance with voltage levels of the LIO signal lines for the memory read operation. For the memory write operation, the IO line coupling circuit couples and decouples each of the GIO signal lines to and from a respective one of the LIO signal lines. The data path further includes a first precharge circuit coupled to the GIO signal lines to couple the GIO signal lines to ground for precharging the signal lines prior to a memory read or write operation.

In another aspect of the invention, a data path includes a first pair of data signal lines coupled to a first column of memory including a first memory cell, a second pair of data signal lines coupled to a second column of memory including a second memory cell, and a third pair of data signal lines coupled to an input of the IO line sense amplifier. First and second IO line coupling circuits are coupled to the first and second data signal lines, respectively. Each coupling circuit is further coupled to the third pair of data signal lines to couple and decouple each of the signal lines of the third pair to and from a voltage supply in accordance with voltage levels of the signal lines of the first pair or the voltage levels of the signal lines of the second pair during a memory read operation. In a test mode, the first and second coupling circuits couple and decouple each of the signal lines of the third pair to and from the voltage supply in accordance with voltage levels of the signal lines of the first pair and the voltage levels of the signal lines of the second pair. The data path further includes a test compression circuit coupled to the third pair of data signal lines operable in the test mode to compare voltage levels of each of the third pair of data signal lines to a reference voltage, and in response, generate an output test signal indicative of whether the voltage levels of the signal lines of the third pair relative to the reference voltage are complementary or the same and therefrom determine whether either of the first and second memory cells are defective.

DETAILED DESCRIPTION OF PREFERRED EMBODIMENTS

Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 3:
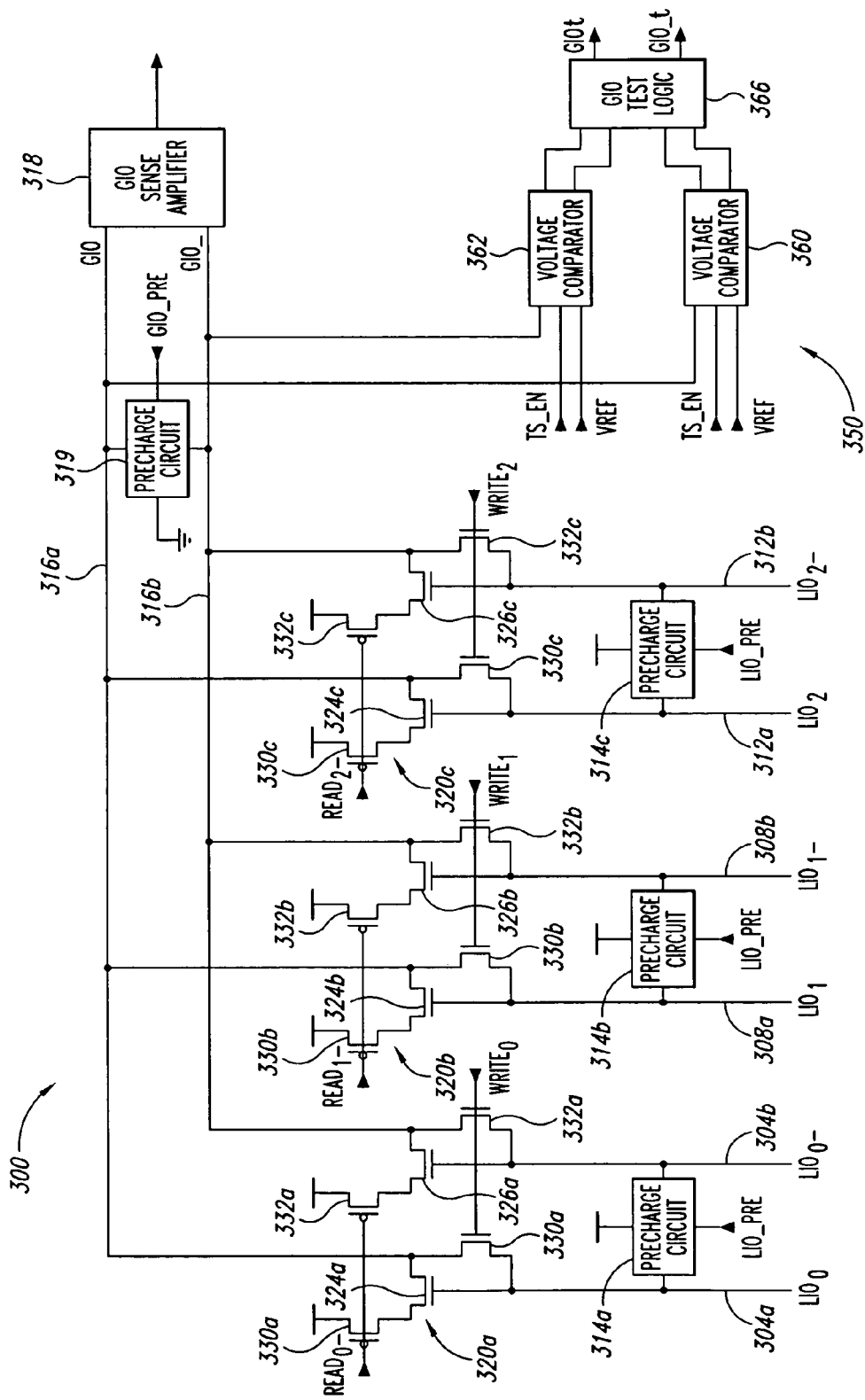
FIG. 3 is a partial block diagram of a data path according to an embodiment of the present invention that can be implemented in the memory device of FIG. 1.

FIG. 3 illustrates a data path 300 according to an embodiment of the present invention. The data path 300 includes three local input/output (LIO) lines 304, 308, 312 coupled to a global input/output (GIO) line 316. It will be appreciated by those ordinarily skilled in the art that greater or fewer LIO lines can be coupled to the GIO line 316 without departing from the scope of the present invention. The LIO lines 304, 308, 312 are shown in FIG. 3 for merely the purpose of providing an example. Each of the LIO lines 304, 308, 312 is formed from a pair of respective signals lines that couple voltage signals representative of complementary logic states. Precharge circuits 314 are coupled to the signal lines of the LIO lines 304, 308, 312 to precharge the signal lines to a LIO precharge voltage level. In the embodiment illustrated in FIG. 3, the precharge circuits 314 are coupled to an internal voltage supply VINT which is used to precharge the signal lines of the LIO lines 304, 308, 312 in response to an active LIO precharge signal LIO_PRE. The precharge circuits 314 are conventional, and suitable precharge circuits are well known in the art.

The GIO line 316 is formed from a pair of signal lines that couple voltage and current signals representative of complementary logic states from the LIO lines 304, 308, 312 to a conventional GIO sense amplifier 318. The GIO line 316, in comparison to the LIO lines 304, 308, 312, is typically a physically longer signal path, which results in the GIO line 316 having greater inherent capacitance than the LIO lines 304, 308, 312. The voltage and current signals coupled to the GIO line 316 are detected by the GIO sense amplifier 318, as well known in the art, which generates an output signal in response. The output signal is provided to the output buffer 56 (FIG. 1) which generates a data signal that is output onto the data bus 58. The GIO line 316 is further coupled to the signal lines of the GIO line 316 is a precharge circuit 319 to precharge the signal lines to ground in response to an active GIO precharge signal GIO_PRE in preparation for a memory access operation.

Each of the LIO lines 304, 308, 312 is coupled to a respective input/output (IO) coupling circuit 320a–320c which selectively couples and decouples the signal lines of the GIO line 316 to and from the internal voltage supply VINT in response to the voltage signal of the respective LIO signal lines. In this manner, the voltage signals of the LIO lines resulting from the coupling of a column of memory are translated into electrical signals coupled to the GIO line 316. The IO coupling circuits 320a–320c include a pair of NMOS transistors 324, 326 having drains coupled through respective PMOS transistors 330, 332 to the internal voltage supply VINT, and sources coupled to respective signal lines of the GIO line 316. The gates of the NMOS transistors 324, 326 are coupled to the LIO signal lines. The IO coupling circuits 320a–320c further include a pair of NMOS write transistors 330, 332 that couple a respective LIO line 304, 308, 312 to the GIO line 316 in the event a memory write operation is performed to the particular LIO line. An active write signal WRITEn is applied to the pair of NMOS write transistors 330, 332 of the LIO line 304, 308, 312 to which the write operation is directed. An active low read signal READn_ is applied to the gates of the PMOS transistors 330, 332 when a read operation is performed.

In operation, the LIO lines 304, 308, 312 are precharged to the internal voltage level VINT by the precharge circuits 314. The GIO line 316 is precharged to ground by the precharge circuit 319. A memory cell in a memory array is accessed in a conventional manner to generate voltage signals representative of complementary logic states. As known in the art, the voltage signals are typically generated by sense amplifiers that are coupled to the columns of memory of the memory array in which the memory cell to be accessed is located. The output of one of the sense amplifiers is coupled to the LIO line associated with the memory array in which the accessed memory cell is located.

Further operation will be described with respect to the LIO line 308. However, it will be appreciated by those ordinarily skilled in the art that operation for the LIO lines 304 and 312 will be the same as that described below. In the event the access operation is a read operation, prior to the coupling of the voltage signals from the selected sense amplifier to the LIO line 308, an active $READ_1$ signal is applied to the PMOS transistors 330b, 332b of the IO coupling circuit 320b. Since the LIO line 308 is precharged to the VINT voltage level, the NMOS transistors 324, 326 are conductive at the time the PMOS transistors 330b, 332b are switched ON by the active $READ_1$ signal. Consequently, both the signal lines of the GIO line 316 are coupled to the VINT voltage supply. Due to the inherent capacitance of the physically long GIO line 316, however, the voltage levels of the signal lines 316a, 316b, which were precharged to ground, do not change immediately when coupled to the VINT voltage supply.

Figure 1:
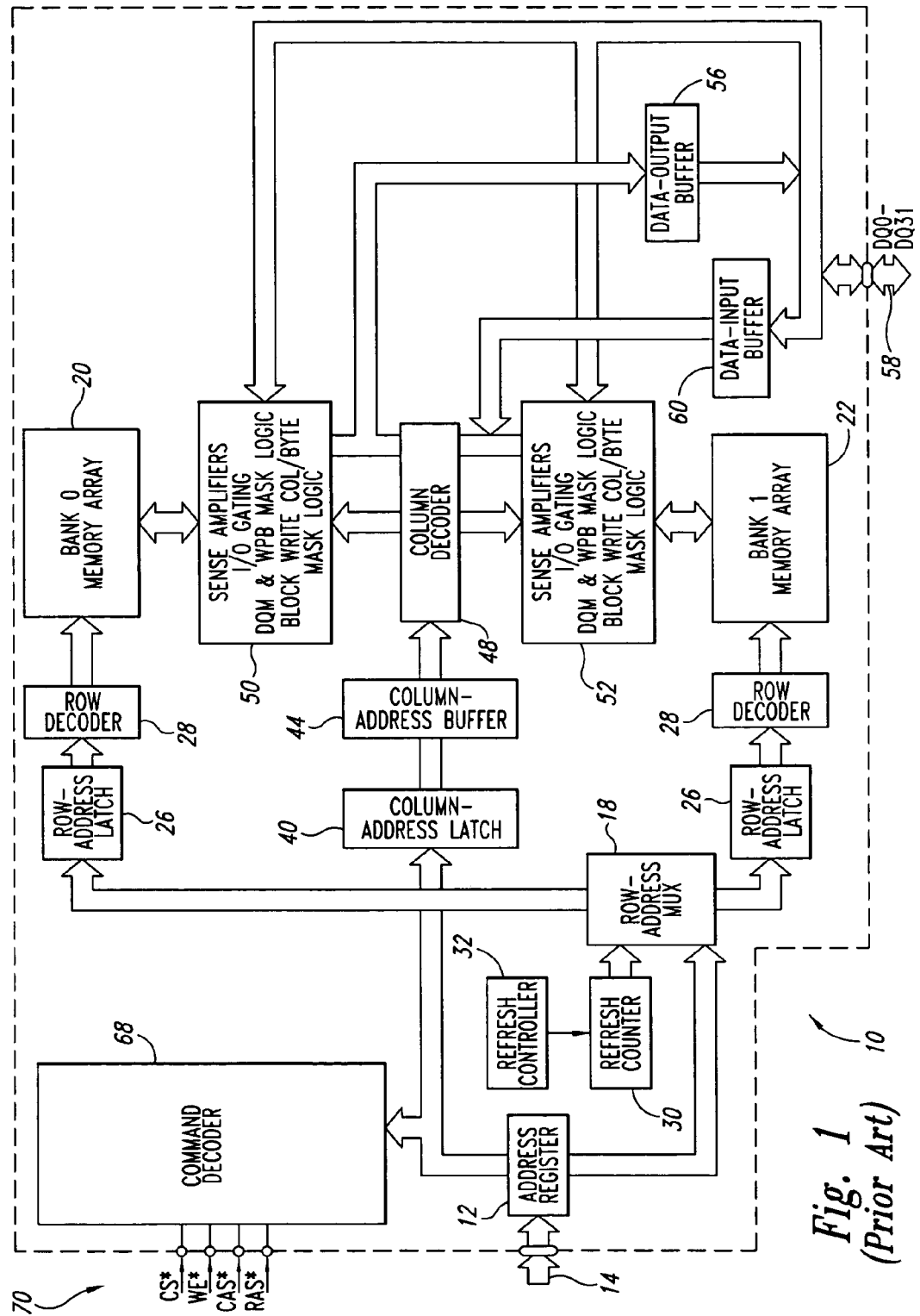
FIG. 1 is a block diagram of a conventional memory device.
Figure 2:
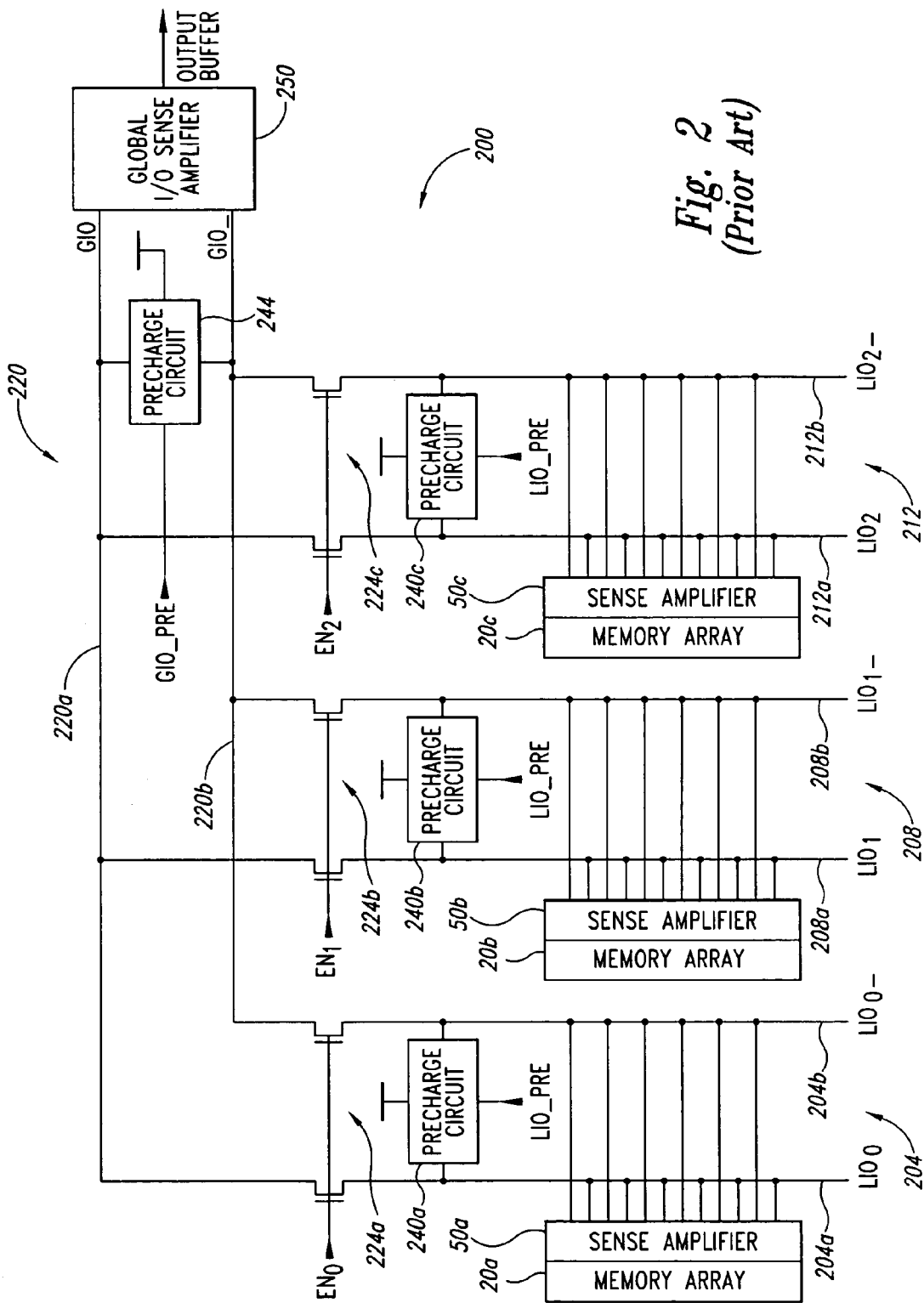
FIG. 2 is a partial block diagram of a conventional data path of the memory device of FIG. 1.

Before the voltage levels of the signal lines of the GIO line 316 significantly change, the voltage signals of the selected sense amplifier are coupled to the LIO line 308, as previously described. The coupling of the voltage signals to the signal lines 308a, 308b causes one of the NMOS transistors 324b, 326b to switch OFF, thereby decoupling the respective GIO signal line 316a, 316b from the VINT voltage supply. As a result, at least one of a voltage and current difference is caused in the GIO signal lines 316a, 316b, with current continuing to flow in the signal line coupled to the VINT voltage supply and current no longer flowing in the signal line decoupled from the VINT voltage supply. The voltage and/or current difference in the signal lines 316a, 316b is detected by the GIO sense amplifier 318 and in response, an output signal is generated which is provided to the output buffer 56 (FIG. 1). To complete the read operation for the data path 300, the $READ_1$ signal becomes inactive to switch OFF the PMOS transistors 330b, 332b, and the signal lines of the LIO line 308 and the GIO line 316 are precharged to the appropriate voltage level by the precharge circuits 314b and 319, respectively.

In the event the access operation is a write operation, the sense amplifier corresponding to the memory cell to which data will be written is coupled to the LIO line 308. An active $WRITE_1$ signal is then applied to the NMOS write transistors 330b, 332b to couple the LIO line 308 to the GIO line 316. As previously discussed, the GIO line 316 is physically long and has much greater inherent capacitance than the LIO line 308. As a result, when the LIO line 308 and the GIO line 316 are coupled together, the VINT voltage level at which the LIO line 308 is precharged changes to the ground level at which the GIO line 316 is precharged. To write the data to the memory cell, the GIO signal lines 316a, 316b are driven by the GIO sense amplifier 318 to the appropriate voltage levels representative of the data and its complement in order to set the selected sense amplifier (not shown) coupled to the LIO signal lines 308a, 308b to the appropriate voltage levels to write the data to the memory cell. As known in the art, the speed at which a sense amplifier is set to the appropriate voltage levels is based on the time to drive one input/output node of the sense amplifier to ground. In the data path 300, although the LIO line 308 is precharged to the VINT voltage level, the input/output nodes of the sense amplifier are driven to a ground level during a write operation when the LIO signal lines 308a, 308b are coupled to the GIO signal lines 316a, 316b, which were precharged to a ground level. Since the voltage levels of the LIO signal lines of 308a, 308b start out at a ground level as soon as they are coupled to the GIO signal lines 316a, 316b, and are then driven to the complementary voltage levels by the GIO sense amplifier 318, the data path 300 provides faster response for a write operation than conventional data paths typically precharged to the VINT voltage level. Consequently, during a write operation, the data path 300 requires less time to set the input/output nodes of the sense amplifier associated with the memory cell to which data is being written to the appropriate complementary voltage levels to write the data to the memory cell.

FIG. 3 further illustrates a GIO test compression circuit 350 according to an embodiment of the present invention coupled to the data path 300. The GIO test compression circuit 350 can be coupled to the data path 300 where test compression functionality is desirable. As will be explained in more detail below, the GIO test compression circuit 350 facilitates testing of the memory device having the data path 300 by allowing the LIO lines 304, 308, 312 to be concurrently coupled to the GIO line 316 and being able to make a determination of the functionality of the memory cells based on the voltage levels of the GIO signal lines 316a, 316b. As previously discussed, pass gates are used in conventional data paths to couple LIO lines to a GIO line. In the conventional arrangement, row test compression implemented by concurrently coupling multiple LIO lines to the GIO line is not possible since an unpredictable state will occur in the event an error is detected. As a result, where a memory cell failure occurs, it is uncertain whether the failure will consistently be detected by a memory tester. The GIO test compression circuit 350 includes voltage comparators 360, 362, each coupled to a respective signal line of the GIO line 316. Each voltage comparator 360, 362 further receives a reference voltage VREF. The VREF voltage is approximately [(VINT−Vtn)/2], where VINT is the voltage of the internal voltage supply and Vtn is the threshold voltage of the NMOS transistors 324, 326 of the IO coupling circuit 320.

In operation, during testing of the memory device, the LIO lines 304, 308, 312 are precharged to VINT, and thus, both the NMOS transistors 324, 326 of the respective IO coupling circuits 320a–320c are switched ON. In testing the memory cells, a selected sense amplifier from the respective memory cell arrays associated with each of the LIO lines 304, 308, 312 is coupled to the respective LIO signal lines driving them to complementary voltage levels. In response, the voltage levels output by the sense amplifiers cause one of the NMOS transistors 324, 326 of the respective IO coupling circuit 320a–320c to switch OFF. Active READn signals are then applied to the PMOS transistors 330, 332 of the respective IO coupling circuits 320a–320c. As a result, one of the GIO signal lines 316a, 316b is coupled to the VINT voltage supply through the NMOS transistor 324, 326 that remains ON and the PMOS transistor 330, 332 switched ON by the active READn signals.

To determine whether any one of the memory cells that are coupled to the LIO lines 304, 308, 312 through the respective sense amplifiers is defective, the voltage comparators 360, 362 compare the voltage levels of the GIO signal lines 316a, 316b relative to the VREF voltage. The voltage comparators 360, 362 are enabled by an active TS_EN signal. Where none of the memory cells coupled to the LIO lines 304, 308, 312 are defective, the GIO signal lines 316a, 316b are at complementary voltage levels since the coupling of one of the GIO signal lines 316a, 316b to the VINT voltage supply is the same for each of the IO coupling circuits 320a–320c. That is, the same NMOS transistor 324 or 326 for each of the IO coupling circuits 320a–320c remains ON after the respective sense amplifiers are coupled to the LIO lines 304, 308, 312. Consequently, one of the GIO signal lines 316a, 316b will be driven to a voltage level of VINT−Vtn (i.e., the GIO signal line that remains coupled to the VINT voltage supply through all of the IO coupling circuits 320) while the other remains at ground (i.e., the GIO signal line that is decoupled from the VINT voltage supply through all of the IO coupling circuits 320).

The voltage comparators 360, 362 coupled to a respective GIO signal line 316a, 316b compare the voltage level of the respective signal line to the VREF voltage, which as previously discussed, is typically [(VINT−Vtn)/2], and generates in response, output signals that are coupled to a GIO test logic circuit 366. Based on the output of the voltage comparators 360, 362, the GIO test logic circuit 366 will output complementary GIO test signals indicative of the pass or fail condition of one of the memory cells under test. The GIO test signals are provided to a conventional memory tester to record the pass or fail condition. In the present example, where none of the memory cells under test are defective, the GIO test signals will have complementary logic levels that are recorded by the memory tester.

In contrast, where one or more of the memory cells under test is defective, the conductive state of the NMOS transistors 330, 332 coupled to the LIO signal lines that are coupled to a defective memory cell will be opposite of the conductive state of the NMOS transistors 330, 332 coupled to the LIO signal lines that are coupled to functional memory cells. As a result, the GIO signal lines 316a, 316b will have a common voltage level instead of complementary voltage levels and the voltage comparators 360, 362 and the GIO test logic 366 will provide GIO test signals that have the same logic level.

Figure 4:
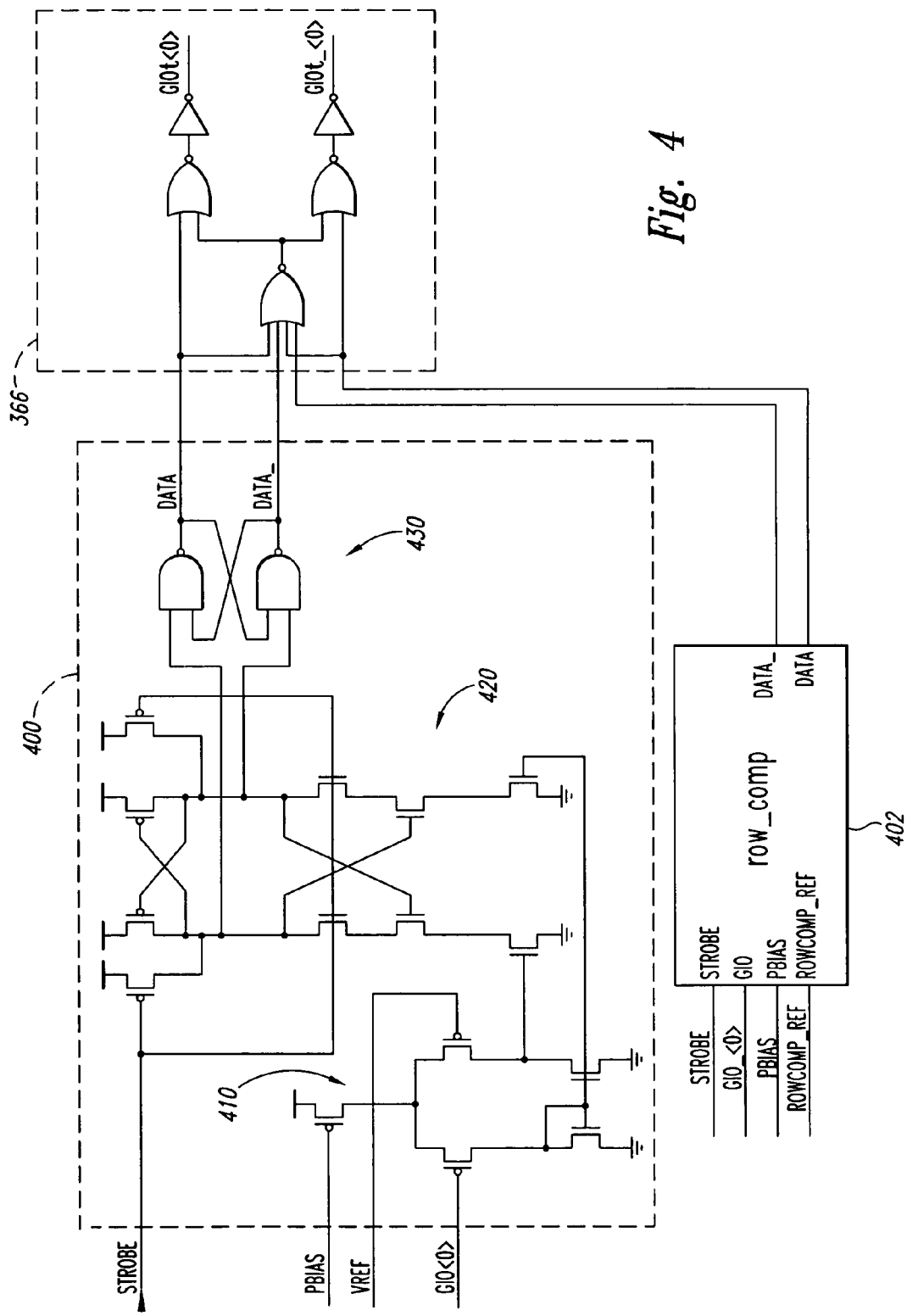
FIG. 4 is a schematic drawing of a voltage comparator according to an embodiment of the present invention that can be used in the data path of FIG. 3.

FIG. 4 shows voltage comparators 400, 402 according to an embodiment of the present invention coupled to the GIO test logic circuit 366. The voltage comparators 400, 402 can be substituted for the voltage comparators 360, 362 shown in FIG. 3. The voltage comparators 400 and 402 are the same, and consequently, the following description of the voltage comparator 400 is applicable for the voltage comparator 402 as well. The voltage comparator 400 includes a differential voltage input stage 410 to compare the voltage level of the GIO line to which the voltage comparator 400 is coupled to the reference voltage VREF. The voltage level of the GIO line is shown in FIG. 4 as the GIO<0> signal. The input stage 410 is activated by an active LOW bias signal PBIAS_. Coupled to the output of the input stage 410 is a differential amplifier stage 420. The amplifier stage 420 is activated and reset in response to a strobe signal STROBE. When the STROBE signal is at a HIGH logic level, the amplifier stage 420 is enabled to sense a voltage difference between the output signals of the input stage 410 and generate complementary output signals. In response to the STROBE signal having a LOW logic level, the amplifier stage 420 is reset. Coupled to the output of the amplifier stage 420 is an active low set-reset (SR) latch 430 for latching the logic state of the output signals of the amplifier stage 420. In this manner, the amplifier stage 420 can be enabled to sense a voltage difference between the output signals of the input stage 410, generate output signals that are latched by the SR latch 430, and then disabled in order to limit further power consumption. The output signals of the voltage comparators 400, 402 are coupled to the GIO test logic circuit 366, which generates the GIO test signals in response. As previously discussed, the GIO test signals can be coupled to a memory tester to record the pass or fail status for the memory device.

Figure 5:
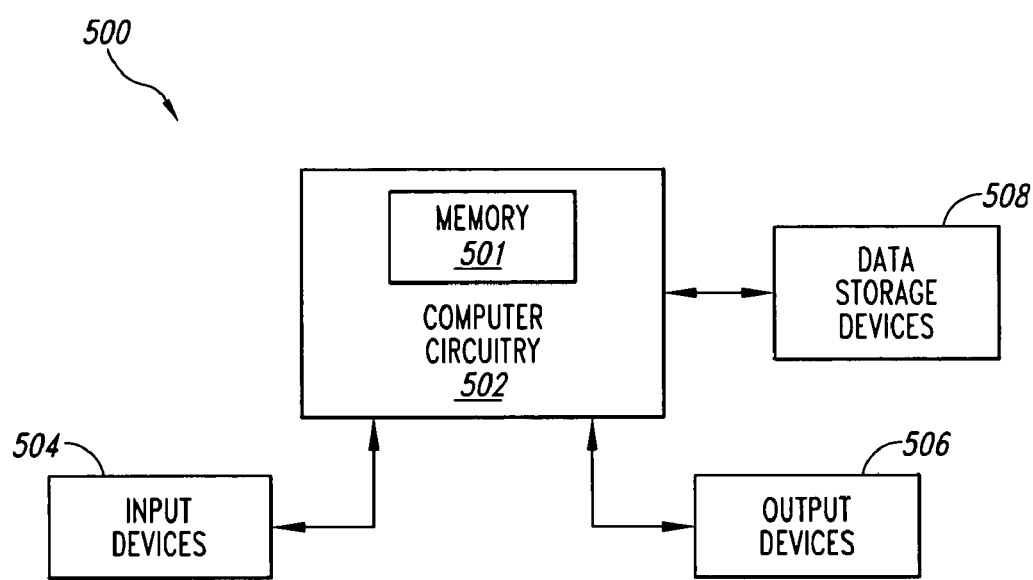
FIG. 5 is a functional block diagram of a processor-based system having a memory device in which the data path according to an embodiment of the present invention is implemented.

FIG. 5 is a block diagram of a processor-based system 500 including computer circuitry 502 having a memory device 501 in which a data path according to an embodiment of the present invention is included. Typically, the computer circuitry 502 is coupled through address, data, and control buses to the memory device 501 to provide for writing data to and reading data from the memory device. The computer circuitry 502 includes circuitry for performing various computing functions, such as executing specific software to perform specific calculations or tasks. In addition, the computer system 500 includes one or more input devices 504, such as a keyboard or a mouse, coupled to the computer circuitry 502 to allow an operator to interface with the computer system. Typically, the computer system 500 also includes one or more output devices 506 coupled to the computer circuitry 502, such as output devices typically including a printer and a video terminal. One or more data storage devices 508 are also typically coupled to the computer circuitry 502 to store data or retrieve data from external storage media (not shown). Examples of typical storage devices 508 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. Such modifications are well within the skill of those ordinarily skilled in the art. Accordingly, the invention is not limited except as by the appended claims.

What is claimed is:

1. A data path for coupling data between a memory cell and an input/output (IO) line sense amplifier, the data path comprising:
   a pair of global input/output (GIO) signal lines coupled to an input of the IO line sense amplifier;
   a pair of local input/output (LIO) signal lines having coupled to a column of memory including the memory cell during a memory read or write operation;
   an IO line coupling circuit coupled to the GIO and LIO signal lines, the coupling circuit operable for the memory read operation to couple and decouple each of the GIO signal lines to and from a voltage supply in accordance with voltage levels of the LIO signal lines and further operable for the memory write operation to couple and decouple each of the GIO signal lines to and from a respective one of the LIO signal lines; and
   a first precharge circuit coupled to the GIO signal lines and operable to couple the GIO signal lines to ground to precharge the signal lines prior to a memory read or write operation.

2. The data path of claim 1, further comprising a second precharge circuit coupled to the LIO signal lines and operable to couple the LIO signal lines to the voltage supply to precharge the signal lines prior to a memory read or write operation.

3. The data path of claim 1 wherein the IO line coupling circuit comprises:
   a pair of p-channel MOS transistors, each having a source coupled to the voltage supply and a drain, each p-channel MOS transistor further having a gate coupled to receive a read activation signal;
   a first pair of n-channel MOS transistors, each having a drain coupled to the drain of a respective one of the p-channel MOS transistors and having a source coupled to a respective one of the GIO signal lines, each n-channel MOS transistor further having a gate coupled to a respective one of the LIO signal lines; and
   a second pair of n-channel MOS transistors, each having a drain coupled to a respective one of the GIO signal lines and a source coupled to a respective one of the LIO signal lines, and further having a gate coupled to receive a write activation signal.

4. The data path of claim 1 wherein the GIO signal line has an inherent capacitance greater than the inherent capacitance of the LIO signal lines.

5. The data path of claim 1, further comprising a test compression circuit coupled to the GIO signal lines operable in a test mode to compare voltage levels of each of the respective GIO signal lines to a reference voltage, and in response, generate an output test signal indicative of whether the voltage levels of the GIO signal lines relative to the reference voltage are complementary or the same.

6. The data path of claim 5 wherein the test compression circuit comprises:
   first and second voltage comparison circuits, each voltage comparison circuit coupled to a respective one of the GIO signal lines and having differential amplifier having a first input coupled to the respective GIO signal line and a second input coupled to a reference voltage supply, each voltage comparison circuit having an amplifier stage coupled to the differential amplifier stage to amplify the voltage difference between the voltage level of the GIO signal line to which the differential amplifier stage is coupled and the reference voltage, and further having an output stage to provide output signals indicative of the amplified voltage difference; and
   a logic circuit coupled to the output stages of the first and second voltage comparison circuits operable to compare the output signals of the first and second voltage comparison circuits and generate in response test compression signals indicative of whether the voltage levels of the GIO signal lines relative to the reference voltage complementary or the same.

7. A memory device, comprising:
   an address bus;
   a control bus;
   an address decoder coupled to the address bus;
   a control circuit coupled to the control bus;
   a memory-cell array coupled to the address decoder and control circuit
   a read/write circuit coupled to the memory-cell array;
   an output data buffer; and
   a data path coupled to a read/write circuit and the output data buffer for coupling data between a memory cell and an input/output (IO) line sense amplifier, the data path comprising:
      a pair of global input/output (GIO) signal lines coupled to an input of the IO line sense amplifier;
      a pair of local input/output (LIO) signal lines having coupled to a column of memory including the memory cell during a memory read or write operation;

an IO line coupling circuit coupled to the GIO and LIO signal lines, the coupling circuit operable for the memory read operation to couple and decouple each of the GIO signal lines to and from a voltage supply in accordance with voltage levels of the LIO signal lines and further operable for the memory write operation to couple and decouple each of the GIO signal lines to and from a respective one of the LIO signal lines; and a first precharge circuit coupled to the GIO signal lines and operable to couple the GIO signal lines to ground to precharge the signal lines prior to a memory read or write operation.

8. The memory device of claim 7 wherein the data path further comprises a second precharge circuit coupled to the LIO signal lines and operable to couple the LIO signal lines to the voltage supply to precharge the signal lines prior to a memory read or write operation.

9. The memory device of claim 7 wherein the IO line coupling circuit of the data path comprises:

a pair of p-channel MOS transistors, each having a source coupled to the voltage supply and a drain, each p-channel MOS transistor further having a gate coupled to receive a read activation signal;

a first pair of n-channel MOS transistors, each having a drain coupled to the drain of a respective one of the p-channel MOS transistors and having a source coupled to a respective one of the GIO signal lines, each n-channel MOS transistor further having a gate coupled to a respective one of the LIO signal lines; and a second pair of n-channel MOS transistors, each having a drain coupled to a respective one of the GIO signal lines and a source coupled to a respective one of the LIO signal lines, and further having a gate coupled to receive a write activation signal.

10. The memory device of claim 7 wherein the GIO signal line of the data path has an inherent capacitance greater than the inherent capacitance of the LIO signal lines.

11. The memory device of claim 7 wherein the data line further comprises a test compression circuit coupled to the GIO signal lines operable in a test mode to compare voltage levels of each of the respective GIO signal lines to a reference voltage, and in response, generate an output test signal indicative of whether the voltage levels of the GIO signal lines relative to the reference voltage are complementary or the same.

12. The memory device of claim 11 wherein the test compression circuit comprises:

first and second voltage comparison circuits, each voltage comparison circuit coupled to a respective one of the GIO signal lines and having differential amplifier having a first input coupled to the respective GIO signal line and a second input coupled to a reference voltage supply, each voltage comparison circuit having an amplifier stage coupled to the differential amplifier stage to amplify the voltage difference between the voltage level of the GIO signal line to which the differential amplifier stage is coupled and the reference voltage, and further having an output stage to provide output signals indicative of the amplified voltage difference; and a logic circuit coupled to the output stages of the first and second voltage comparison circuits operable to compare the output signals of the first and second voltage comparison circuits and generate in response test compression signals indicative of whether the voltage levels of the GIO signal lines relative to the reference voltage complementary or the same.

13. A processor-based system, comprising:

a data input device;
a data output device;
a processor coupled to the data input and output devices; and
a memory device coupled to the processor, the memory device comprising:
an address bus;
a control bus;
an address decoder coupled to the address bus;
a control circuit coupled to the control bus;
a memory-cell array coupled to the address decoder and control circuit
a read/write circuit coupled to the memory-cell array;
an output data buffer; and
a data path coupled to a read/write circuit and the output data buffer for coupling data between a memory cell and an input/output (IO) line sense amplifier, the data path comprising:

a pair of global input/output (GIO) signal lines coupled to an input of the IO line sense amplifier;

a pair of local input/output (LIO) signal lines having coupled to a column of memory including the memory cell during a memory read or write operation;

an IO line coupling circuit coupled to the GIO and LIO signal lines, the coupling circuit operable for the memory read operation to couple and decouple each of the GIO signal lines to and from a voltage supply in accordance with voltage levels of the LIO signal lines and further operable for the memory write operation to couple and decouple each of the GIO signal lines to and from a respective one of the LIO signal lines; and a first precharge circuit coupled to the GIO signal lines and operable to couple the GIO signal lines to ground to precharge the signal lines prior to a memory read or write operation.

14. The processor-based system of claim 13 wherein the data path further comprises a second precharge circuit coupled to the LIO signal lines and operable to couple the LIO signal lines to the voltage supply to precharge the signal lines prior to a memory read or write operation.

15. The processor-based system of claim 13 wherein the IO line coupling circuit of the data path comprises:

a pair of p-channel MOS transistors, each having a source coupled to the voltage supply and a drain, each p-channel MOS transistor further having a gate coupled to receive a read activation signal;

a first pair of n-channel MOS transistors, each having a drain coupled to the drain of a respective one of the p-channel MOS transistors and having a source coupled to a respective one of the GIO signal lines, each n-channel MOS transistor further having a gate coupled to a respective one of the LIO signal lines; and a second pair of n-channel MOS transistors, each having a drain coupled to a respective one of the GIO signal lines and a source coupled to a respective one of the LIO signal lines, and further having a gate coupled to receive a write activation signal.

16. The processor-based system of claim 13 wherein the GIO signal line of the data path has an inherent capacitance greater than the inherent capacitance of the LIO signal lines.

17. The processor-based system of claim 13 wherein the data line further comprises a test compression circuit coupled to the GIO signal lines operable in a test mode to compare voltage levels of each of the respective GIO signal lines to a reference voltage, and in response, generate an output test signal indicative of whether the voltage levels of the GIO signal lines relative to the reference voltage are complementary or the same.

18. The processor-based system of claim 17 wherein the test compression circuit comprises:

first and second voltage comparison circuits, each voltage comparison circuit coupled to a respective one of the GIO signal lines and having differential amplifier having a first input coupled to the respective GIO signal line and a second input coupled to a reference voltage supply, each voltage comparison circuit having an amplifier stage coupled to the differential amplifier stage to amplify the voltage difference between the voltage level of the GIO signal line to which the differential amplifier stage is coupled and the reference voltage, and further having an output stage to provide output signals indicative of the amplified voltage difference; and a logic circuit coupled to the output stages of the first and second voltage comparison circuits operable to compare the output signals of the first and second voltage comparison circuits and generate in response test compression signals indicative of whether the voltage levels of the GIO signal lines relative to the reference voltage complementary or the same.

19. A method for coupling data between a memory cell in a memory array to and from an input/output sense amplifier, the method comprising:

precharging a pair of global data lines to ground;

in the event of a read operation, coupling the global data lines to a voltage supply, coupling the data from the memory cell and complementary data to a pair of local data lines, and decoupling one of the global data lines from the voltage supply based on the data and its complement coupled to the local data lines; and in the event of a write operation, coupling the memory cell to the pair of local data lines, coupling each of the global data signal lines to a respective one of the local data lines, and coupling complementary data representing the data to be written to the memory cell to the global data signal lines.

20. The method of claim 19, further comprising precharging the local data lines to an internal voltage level.

21. The method of claim 19, further comprising:

generating complementary voltage signals representative of the data of the memory cell;

coupling the complementary voltage signals to the pair of local data lines; and switching off one of a pair of switches coupling the global data line to the voltage supply.

\* \* \* \* \*